US012760404B2

(12) United States Patent
Six

(10) Patent No.: US 12,760,404 B2
(45) Date of Patent: Oct. 13, 2026

(54) METHOD FOR DEPOSITING A LAYER OPTICAL ELEMENT, AND OPTICAL ASSEMBLY FOR THE DUV WAVELENGTH RANGE

(71) Applicant: Carl Zeiss SMT GmbH, Oberkochen (DE)

(72) Inventor: Stephan Six, Augsburg (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 18/394,473

(22) Filed: Dec. 22, 2023

(65) Prior Publication Data

US 2024/0167145 A1 May 23, 2024

Related U.S. Application Data

(63) Continuation of application No. PCT/EP2022/065738, filed on Jun. 9, 2022.

(30) Foreign Application Priority Data

Jun. 30, 2021 (DE) ......................... 102021206788.3

(51) Int. Cl.
*C23C 14/04* (2006.01)
*C23C 14/46* (2006.01)
(Continued)

(52) U.S. Cl.
CPC ............ *C23C 14/044* (2013.01); *C23C 14/46* (2013.01); *C23C 14/505* (2013.01); *C23C 14/542* (2013.01); *G03F 7/162* (2013.01)

(58) Field of Classification Search
CPC ....... C23C 14/04; C23C 14/46; C23C 14/505; C23C 14/542
See application file for complete search history.

(56) References Cited

U.S. PATENT DOCUMENTS 4,140,078 A * 2/1979 Wilmanns ............. C23C 14/547 204/298.03
4,543,910 A * 10/1985 Dobrowolski ........ C23C 14/044 118/504

(Continued)

FOREIGN PATENT DOCUMENTS

DE 19811873 A1 9/1998
DE 10239163 A1 3/2004

(Continued)

OTHER PUBLICATIONS

International Preliminary Report on Patentability and the Written Opinion, PCT/EP2022/065738, Dec. 14, 2023, 11 pages.

(Continued)

*Primary Examiner* — Dah-Wei D. Yuan
*Assistant Examiner* — Kristen A Dagenais
(74) *Attorney, Agent, or Firm* — Edell, Shapiro & Finnan, LLC

(57) ABSTRACT

A method for depositing a layer (2) of a coating which is reflective or anti-reflective to DUV radiation onto a surface (3*a*) of a substrate (3) for a DUV optical element includes: transferring a coating material (M) into the gas phase in a coating source (4'), moving the substrate relative to the coating source along a predetermined movement path (5), and varying a coating rate (RB) and/or a rotation speed (ω(t)) of a spin axis (7) of the substrate during the movement along the movement path. A covering element (6) is arranged between the coating source (4') and the surface and covers the surface at least partially during the movement of the substrate. Also disclosed is an optical element for the DUV wavelength range, with a substrate and a reflective or anti-reflective coating (B) applied to the substrate, having at least one layer deposited by the disclosed method.

7 Claims, 2 Drawing Sheets

(51) Int. Cl.

| | |
|---|---|
| ***C23C 14/50*** | (2006.01) |
| ***C23C 14/54*** | (2006.01) |
| ***G03F 7/16*** | (2006.01) |

(56) References Cited

U.S. PATENT DOCUMENTS

| | | | | |
|---|---|---|---|---|
| 5,993,904 | A * | 11/1999 | Boucher | C23C 14/044 204/192.12 |
| 2002/0134668 | A1* | 9/2002 | Wan | C23C 14/044 427/523 |
| 2004/0035363 | A1 | 2/2004 | Braun et al. | |
| 2004/0052942 | A1 | 3/2004 | Bijkerk et al. | |
| 2010/0215932 | A1* | 8/2010 | Schreiber | G02B 5/0833 428/428 |
| 2011/0223346 | A1 | 9/2011 | Kitada et al. | |
| 2020/0199741 | A1 | 6/2020 | Mebarki et al. | |

FOREIGN PATENT DOCUMENTS

| | | | | |
|---|---|---|---|---|
| DE | 102010002359 | A1 | 9/2010 | |
| DE | 102012215359 | A1 * | 3/2014 | C23C 14/225 |
| EP | 2715412 | A1 | 4/2014 | |
| JP | 2006183093 | A | 7/2006 | |
| JP | 2009079276 | A | 4/2009 | |
| WO | 03093529 | A2 | 11/2003 | |
| WO | 2015059228 | A1 | 4/2015 | |
| WO | 2012166484 | A1 | 9/2019 | |

OTHER PUBLICATIONS

German Office Action with English translation, Application No. 10 2021 206 788.3, Feb. 1, 2022, 12 pages.

International Search Report, PCT/EP2022/065738, Sep. 28, 2022, 5 pages.

* cited by examiner

METHOD FOR DEPOSITING A LAYER OPTICAL ELEMENT, AND OPTICAL ASSEMBLY FOR THE DUV WAVELENGTH RANGE

CROSS-REFERENCE TO RELATED APPLICATION

This is a Continuation of International Application PCT/EP2022/065738, which has an international filing date of Jun. 9, 2022, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2021 206 788.3 filed on Jun. 30, 2021.

FIELD OF THE INVENTION

The invention relates to a method for depositing at least one layer of a coating which is reflective or anti-reflective to radiation in the deep ultraviolet (DUV) wavelength range onto a surface to be coated of a substrate for an optical element for the DUV wavelength range. The invention also relates to an optical element for the DUV wavelength range, which comprises a substrate and a reflective or anti-reflective coating which is applied to the substrate and has at least one layer deposited by such a method. The invention also relates to an optical arrangement, which contains at least one such optical element.

BACKGROUND

Such depositing method comprises: converting a coating material into the gas phase using a coating source, moving the substrate relative to the coating source along a predetermined movement path, wherein the substrate rotates around a spin axis during the movement along the movement path and wherein a covering element is arranged between the coating source and the surface to be coated, which covering element covers the surface to be coated at least partially during the movement along the movement path.

In this application, the DUV wavelength range is understood to mean the wavelength range of electromagnetic radiation between 150 nm and 400 nm. The DUV wavelength range is of importance for microlithography, in particular. Radiation in the DUV wavelength range is thus used e.g. in projection exposure apparatuses and wafer or mask inspection apparatuses. There, both transmitting optical elements, e.g. in the form of lens elements or plane plates, and also reflective optical elements, e.g. in the form of mirrors or the like, can be used. Such optical elements may be integrated, for example, into projection systems or in illumination systems of DUV lithography apparatuses.

During the deposition of anti-reflective coatings onto the substrates of transmitting optical elements for the DUV wavelength range and during the deposition of highly reflective coatings onto the substrates of reflecting optical elements for the DUV wavelength range, the substrates to be coated are moved on a planetary orbit around a coating source, which is typically a thermal evaporator source. During such a planetary movement, the substrate rotates around a spin axis, which in turn moves along a predetermined movement path in the form of a circular path around the evaporator source. The rotation of the spin axis and the rotation of the substrate around the evaporator source are coupled to each other during the planetary movement; both movements are usually performed at a constant rotation speed. The evaporation rate of the coating material is likewise kept as constant as possible during the deposition. Basically, it is possible to vary the substrate speed even for a planetary movement of the substrate, but the structural complexity required for this purpose is considerable (see DE 198 11 873 A1).

With the aid of covering elements (also known as distributor stops), which are positioned between the movement path of the substrate and the evaporator source, a desirable layer thickness profile in the radial direction to the spin axis can be produced on a rotationally symmetric surface of the substrate. However, if the substrate has a surface that is not rotationally symmetric to the spin axis, a layer thickness profile is obtained which varies along the (partial) circles around the spin axis in the azimuthal direction. To compensate for this effect or to achieve any desired (setpoint) layer thickness profiles for an optimum anti-reflective effect or reflective effect in the case of non-radially symmetric light incidence angle profiles in the respective optical system in which the optical element is used, it is necessary to utilize further degrees of freedom. The production of any two-dimensional profiles of the layer thickness of a deposited layer is referred to as free-form coating.

In the literature, e.g. in WO 03/093529 A2 or in JP 2006-183093 A2, methods for free-form coating are described, which use specifically designed evaporator sources or covering elements with holes or honeycombs for layer thickness correction to enable the production of a desired 2-dimensional layer thickness profile. In such a procedure, it is primarily the high local layer thickness variations resulting from the shadow cast by the covering element relative to the source with the coating material that are problematic for the optical performance. With an additional, in particular periodic movement of the covering element relative to the spin axis, as described in US 2004/0052942 A1, this effect can be greatly reduced, but the technical complexity and the susceptibility to interference of this method are very high. Further examples of hole or honeycomb masks are described in U.S. Pat. No. 5,993,904 and DE 102 39 163 A1.

A further disadvantage with the hole or honeycomb masks described above consists in the fact that in order to approximate a desired layer thickness profile, a corrected mask must in each case be prepared with a trial-and-error method. In addition, the use of honeycomb or hole masks, in particular when coating large substrates with a diameter of e.g. over 100 mm, is limited by the mechanical stability (deflection, vibrations during movement, etc.). There are also high demands concerning the manufacturing accuracy of the hole or honeycomb openings (approx. 5 μm accuracy of the opening diameter for 0.5% layer thickness accuracy). A continuous narrowing of the openings due to the coating of the mask and also the high manufacturing costs and manufacturing times during the production of the masks represent further disadvantages of this technology. Furthermore, the mask surface is coated, which leads to a reduction of the hole diameters and thus to a change in the layer thickness profile produced with increasing period of use of the mask. Layer stresses can also lead to increased bending of the masks, which makes it necessary to rework or re-manufacture the masks.

A method for coating substrates for optical elements with a free-form coating is disclosed by DE 10 2012 215 359 A1, in which a substrate rotates around a spin axis and a shielding element with an outer contour is arranged between a surface to be coated of the rotating substrate and a source with coating material, wherein the area enclosed by the outer contour at least partially covers the surface to be coated and wherein the impact rate of coating material on the surface to be coated on an arcuate element of the surface to be coated with respect to the spin axis is variably set for different rotation angles of the substrate around the rotation axis and the spin axis is shifted relative to the source depending on the rotation angle of the substrate around the spin axis.

In the method described in DE 10 2012 215 359 A1, the substrate rotating around the spin axis typically crosses the source during the shift, or more precisely a rigid opening in the source in which the coating material is located. By specifying the movement profile, i.e. the path curve and the velocity at a respective position along the path curve, a desired profile of the layer thickness of the deposited layer can be set, which is rotationally symmetric to the spin axis, provided that the surface to be coated of the substrate is also rotationally symmetric to the spin axis. In this case, the layer thickness is constant in the azimuthal direction to the spin axis.

In the event that a non-rotationally symmetric profile of the layer thickness of the deposited layer or a non-rotationally symmetric surface to be coated of the substrate is to be provided with any arbitrary layer thickness profile, this requires a variable setting of the impact rate of the coating material on the surface to be coated depending on the rotation angle around the spin axis. As described in DE 10 2012 215 359 A1, for this purpose, for example, the angular velocity of the substrate during the rotation around the spin axis can be set temporally variably or the rate at which the source releases the coating material can be set variably depending on the rotation angle of the substrate around the spin axis.

The method described in DE 10 2012 215 359 A1 is used in particular for free-form coating of optical elements for EUV lithography. The target of a non-reactive DC magnetron sputtering apparatus is used there as the source for the coating material. In this case, the sputtering rate can be variably set by the DC voltage applied to the magnetron sputtering apparatus. It is not possible to perform a non-reactive DC sputtering process when depositing layers of reflective or anti-reflective coatings for optical elements for the DUV wavelength range, since different coating materials are used there than are used for coating optical elements for EUV lithography.

US 2011/0223346 A1 describes a sputter coating apparatus and a method for magnetron sputtering. During the method, the substrate is held rotatably in a substrate holder. The coating apparatus has a control device for adapting the rotation speed of the substrate in dependence on a rotational position of the substrate, which is detected by a position detection device.

SUMMARY

One object of the invention is to provide a method for depositing at least one layer, which enables free-form coating of a substrate of an optical element for the DUV wavelength range.

According to one formulation this object, among others, is achieved by a method of the type specified in the above Background, further comprising: varying a coating rate and/or a rotation speed of the spin axis of the substrate during the movement along the movement path.

For the purposes of this application, the coating rate is understood to mean the rate at which the coating source releases the coating material or transfers it to the gas phase. A distinction must be made between the coating rate and the impact rate at which the coating material transferred to the gas phase impinges on the substrate. The impact rate changes permanently for each substrate point during a coating process with a moving substrate—even if the coating rate is constant—and results in sum over the entire coating process in the respective local layer thickness.

As described further above, the coating rate is kept as constant as possible when coating substrates for optical elements for the DUV wavelength range. Due to the planetary movement in which the rotation around the spin axis of the substrate is coupled to the rotation of the substrate around the source of the coating material, a variation of the rotation speed around the spin axis is typically not possible without a change in the path velocity in conventional coating methods of optical elements for the DUV wavelength range.

The inventor has recognized that the method described in DE 10 2021 215 359 A1 can also be used for depositing layers of coating materials used for anti-reflective or reflective coatings for optical elements for the DUV wavelength range. Due to the additional degree of freedom obtained by the controlled variation of the coating rate or of the rotation speed around the spin axis, arbitrary non-rotationally symmetric thickness profiles can be produced during the deposition of the layer.

In one variant, the coating material deposited on the surface to be coated is an oxide coating material or a fluoride coating material. The coating materials used for (highly) reflective coatings or anti-reflective coatings of optical elements for the DUV wavelength range are typically oxides, e.g. $SiO_2$, $Al_2O_3$, $TiO_2$, $HfO_2$, or fluorides, e.g. $MgF_2$ or $LaF_2$. The non-reactive DC magnetron sputtering described in DE 10 2021 215 359 A1 cannot be used in the deposition of such layers.

In one variant of the method, the coating material forms an electrically insulating, preferably ceramic, sputtering target. In this case, the coating material is transferred into the gas phase with the aid of a pulsed sputtering method or a high-frequency sputtering method on electrically insulating, usually ceramic, sputtering targets, e.g. in the form of oxide sputtering targets made of $SiO_2$, $Al_2O_3$, $HfO_2$, or $TiO_2$. In this case, the coating material transferred into the gas phase in the coating source is deposited on the surface to be coated without reacting with constituent parts of a gas atmosphere in the coating apparatus in which the substrate and the coating source are arranged.

In an alternative variant, the coating material forms an electrically conductive, preferably metallic, sputtering target and the deposition of the at least one layer is carried out (typically by ion-beam sputtering) in an oxygen gas atmosphere or in a fluorine gas atmosphere. In this case, deposition is typically performed by a reactive DC sputtering process. If an oxygen-gas atmosphere is present in the coating apparatus, the electrically conductive coating material, which is transferred into the gas phase in the coating source, is oxidized in the oxygen-gas atmosphere before it is deposited on the surface to be coated of the substrate. The coating material arranged in the coating source may in this case be, for example, an electrically conductive Si target for the deposition of a layer of $SiO_2$, an Al target for the deposition of a layer of $Al_2O_3$, a Hf target for the deposition of a layer of $HfO_2$, or a Ti target for the deposition of a layer of $TiO_2$. For the production of layers of $MgF_2$, $AlF_3$ or $LaF_3$, which are absorption-free in the UV-wavelength range, a magnetron or ion-beam sputtering method can be carried out using a Mg target, an Al target or a La target, wherein a fluorine gas atmosphere is present in the coating apparatus.

In the variant of the method described here, in which the deposition is carried out with the aid of a reactive DC sputtering method on an electrically conductive sputtering target, the coating rate can be varied by varying the DC voltage used for the sputtering process and thus the removal rate of the sputtering target, as is the case with the non-reactive DC sputtering process for free-form coating of optical elements for the EUV wavelength range described further above. In the case of pulsed or RF sputtering methods, a controlled variation of the coating rate is usually possible by varying parameters of the sputter coating source such as the period duration during pulsed sputtering, the radio frequency during RF sputtering, etc.

In an alternative variant, the coating material in a coating source is transferred into the gas phase by thermal evaporation. In this variant, a thermal evaporation process is carried out for the deposition of the at least one layer, in which process the coating rate typically cannot be easily changed in a controlled manner because the noise of the evaporation rate and the inertia of the evaporation rate are many times higher when the evaporation performance changes than is the case with the removal rate of a target material in a sputtering process.

Therefore, when using a coating source in the form of a thermal evaporator source, e.g. an electron beam evaporator or an electric resistance heater, it is usually advantageous to perform a controlled variation of the rotation speed of the spin axis of the substrate, which is dependent on the position of the substrate with respect to the covering element, for producing a free-form coating. In addition, the evaporation rate, which in this case corresponds to the coating rate, should be kept as stable as possible.

In one variant, the coating rate during the movement along the movement path deviates by no more than +/−10% from an average coating rate. As described further above, the evaporation rate of the coating material, which in this case corresponds to the coating rate, should be kept as constant as possible. This can be achieved by precisely setting or, if necessary, regulating the power or energy of an electron beam used for thermal evaporation and by keeping the ambient conditions in the coating apparatus as constant as possible. The average coating rate is understood to be the coating rate that occurs in the (arithmetic) mean during the movement of the substrate along the entire movement path. The average evaporation rate of the evaporator source can be determined, for example, with the aid of one or more sensors and then be regulated.

The controlled variation of the rotation speed of the substrate around the spin axis can be effected depending on the path position along the path curve or the movement path between the substrate and the coating source with the covering element and independently of the path speed of the substrate movement over the coating source. As described further above, in conventional coating apparatuses for coating optical elements for the DUV wavelength range with a central planetary drive, such a controlled variation of the speed of rotation of the substrate around the spin axis is not possible without fundamental modifications because of the fixed ratio of the numbers of planet and spin axis revolutions.

In a further variant, average coating rates in successive time intervals with a time duration that is less by a factor of 50 to 500 than a period duration of the rotation of the substrate around the spin axis deviate by no more than 10%. The average coating rate is defined here as the arithmetic mean, which is related to a respective time interval, as is described further above. The average coating rate should not fluctuate too much in successive time intervals whose time durations are equal to a 50th to a 500th of the duration of a complete substrate rotation around the spin axis. For example, if the substrate rotates completely around the spin axis once in 5 seconds, the time durations of the time intervals are between 100 ms and 10 ms. Small deviations of the average coating rate in successive time intervals on this time scale are due to statistical fluctuations of the coating rate. If the average coating rate in successive time intervals with the time duration specified above deviates significantly, there is a systematic drift of the evaporation or coating rate, which undesirably influences the layer thickness profile resulting at the end of the coating process. In order to meet the abovementioned condition, the period duration of the rotation of the substrate around the spin axis can be specified appropriately or, if the coating rate is monitored, adapted appropriately during the coating process.

In general, the rotation speed of the substrate around the spin axis is changed in dependence on the substrate position along its path curve and the substrate rotational position around the spin axis in a manner such that the desired layer thickness distribution on the substrate surface is present over the entire process. This can be done systematically with the aid of an algorithm based on a calculation of the expected layer thickness for each path position and rotational position of the substrate.

In a further variant, the evaporator source has a cover, which is moved between a first position shadowing the coating material and a second position not shadowing the coating material to vary the coating rate. In this variant, the (effective) coating rate is varied in a controlled manner by intermittently covering and then releasing the coating source in a controlled manner with the aid of the cover. In the first position, the cover usually completely covers the coating source so that in the first position, no coating material passes from the coating source to the surface to be coated of the substrate. In the second position, the cover releases the coating source so that the coating material transferred into the gas phase can reach the surface to be coated. The cover can be quickly moved back and forth between the two positions, for example by quickly rotating the cover around a rotation axis or the like. The cover thus fulfills the function of a chopper and allows a controlled variation of the coating rate when a coating source in the form of a thermal evaporator is used in the method. Basically, such a cover could also be used in a coating source in the form of a sputter source, but it is usually possible there to set the coating rate in a controlled manner even without such a cover, as described further above.

In a further variant, the method comprises: measuring an (actual) layer thickness profile of the deposited layer, determining a deviation between the measured layer thickness profile and a desired layer thickness profile, and adapting a specification for the variation of the coating rate and/or the variation of the rotation speed during the movement of the substrate along the movement path depending on the deviation of the measured layer thickness profile from the desired layer thickness profile.

In addition to the additional degree of freedom for producing arbitrary non-rotationally symmetric thickness profiles of the deposited layer, the free-form coating, using the variation of the coating rate and/or the rotation speed, also opens up the possibility of approaching a desired layer thickness profile with the aid of a trial-and-error method. For this purpose, the three steps of the variant described further above, i.e. the measurement, the determination of the deviation from the desired layer thickness profile and the adaptation of the specification of the variation of the coating rate or the rotation speed, are usually repeated several times, wherein a new layer of a (trial) coating is deposited in each case with the adapted specification. By adapting the specification(s) several times if necessary, the desired layer thickness profile can be approximated iteratively, as far as the process stability permits.

In contrast, it is usually required to produce a new, optimized mask for each deposition process of a layer of a (trial) coating during the trial-and-error method when producing a free-form coating using a pinhole or honeycomb mask. For the optimization of the free-form coating, however, only a control-technical reprogramming of the specification for the variation of the coating rate and/or the rotation speed of the spin axis in dependence on the position of the substrate along the movement path is required in the method described further above, which saves time and money compared to the production of a new mask.

In addition, in the method described here, an approximation to any arbitrary desired layer thickness profile is possible as far as the respective process stability permits it, while manufacturing tolerances in the mask shape and mask optimization in the coating apparatus still have an additional limiting effect on an approximation to a desired layer thickness profile when using new, optimized masks for shadowing the substrate.

In a further variant, the substrate is shifted along a rectilinear movement path relative to the coating source during the movement. During the shift along the rectilinear movement path, the substrate is typically guided over the coating source, i.e. the substrate is arranged at a position along the rectilinear movement path directly above the coating source to apply the free-form coating onto the surface to be coated of the substrate.

A further aspect of the invention relates to an optical element for the DUV wavelength range, which comprises: a substrate and a reflective or anti-reflective coating which is applied to the substrate and has at least one layer deposited by the method described further above.

The (highly) reflective coating or the anti-reflective coating may have only a single layer, which is formed, for example, from a fluoride material, but it is also possible that the coating has two or more layers. In the event that the layers are oxide or fluoride layers, they are typically applied with the aid of the method described further above. If the coating has functional layers and/or a cover layer, they/it can also be applied with the aid of the method described further above. However, it is also possible that such a (thin) layer is applied in another way, for example by atomic layer deposition.

The optical element for the DUV wavelength range can be, for example, a lens element, a mirror, etc., whose surface to be coated is provided with a reflective or anti-reflective effect by way of the coating. The material of the substrate may be glass, e.g. quartz glass, but the material of the substrate may also be a different material, for example an ionic crystal, e.g. a $CaF_2$ crystal.

A further aspect of the invention relates to an optical arrangement for the DUV wavelength range, which has at least one optical element for the DUV range, which is designed as described further above. The optical arrangement can be, for example, a projection exposure apparatus or a wafer or mask inspection apparatus. As described further above, both transmitting optical elements, e.g. in the form of lens elements or plane plates, and also reflective optical elements, e.g. in the form of mirrors or the like, can be used in such an optical arrangement.

Further features and advantages of the invention will be apparent from the description that follows of exemplary embodiments of the invention, with reference to the figures of the drawing, which show details essential to the invention, and from the claims. The individual features can be implemented individually in their own right or collectively in any combination in a variant of the invention.

BRIEF DESCRIPTION OF THE DRAWINGS

Exemplary embodiments are shown in the schematic drawing and are explained in the following description. In the figures.

DETAILED DESCRIPTION

In the description of the drawings that follows, identical reference signs are used for components that are the same or analogous or have the same or analogous function.

Figure 1A:
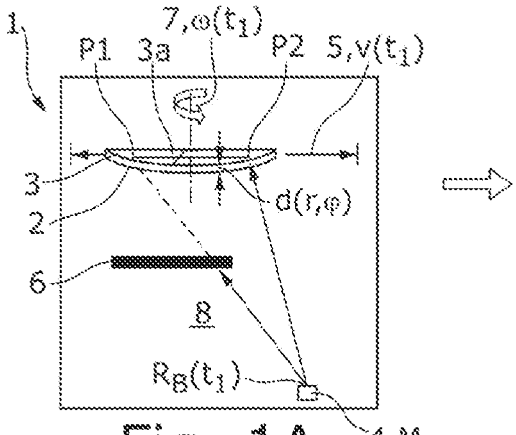
FIGS. 1A,B show schematic illustrations of a coating apparatus having a coating source in the form of a sputter source for depositing a layer onto a surface of a substrate in two angular positions of the substrate with respect to a spin axis, FIGS. 2A,B show schematic illustrations analogous to FIGS. 1A,B, with a coating source in the form of a thermal evaporator, which has a cover for varying the coating rate.

FIGS. 1A,B show a coating apparatus 1 during the deposition of a layer 2 onto a substrate 3. The coating apparatus 1 has a coating source 4, which is shown in the form of a small square in FIGS. 1A,B. In the example shown, the coating source 4 is a sputter source having a coating material M in the form of a sputtering target. The coating material M in the form of the sputtering target is transferred into the gas phase in the coating source 4 by bombarding the sputtering target with high-energy ions. The coating material M transferred into the gas phase passes from the coating source 4 to a surface 3*a* to be coated of the substrate 3 and is deposited in the form of a layer 2 on the surface 3*a* to be coated.

The substrate 3 is shifted during the deposition of the layer 2 in the coating apparatus 1 with the aid of a movement device (not depicted) along a specified movement path 5, which is rectilinear in the example shown, wherein the surface 3*a* to be coated is partially covered or shadowed by a covering element 6 in the form of a stop during the movement along the movement path 5. The effect of the shadowing caused by the covering element 6 is indicated in FIGS. 1A,B by two arrows, which symbolize two trajectories of the coating material M, of which the first terminates at the covering element 6 and the second terminates at the surface 3*a* to be coated.

At the left-hand end of the movement path 5 of the substrate 3 shown in FIGS. 1A,B, there is no longer a direct line of sight between the coating source 4 and the surface 3*a* to be coated due to the covering element 6. At the right-hand end of the movement path 5 shown in FIGS. 1A,B, the entire surface 3*a* to be coated is no longer shadowed by the covering element 6. The substrate 3 is shifted during the deposition of the layer 2 from the left end of the rectilinear movement path 5 to the right end of the rectilinear movement path 5 and in so doing crosses the coating source 4, more precisely an opening in the coating source 4, from which the coating material M emerges. The translational movement of the substrate 3 takes place with a translation speed v(t), which can be kept constant or can be varied during the movement along the movement path 5.

In addition to the translational movement of the substrate 3 relative to the coating source 4 along the rectilinear movement path 5, the substrate 3 also rotates around a spin axis 7 of the substrate 3 during the movement along the movement path 5. In the example shown, in which the surface 3*a* to be coated of the substrate 3 is rotationally symmetric to the spin axis 7, a rotationally symmetric layer thickness profile of the layer 2 applied to the surface 3*a* to be coated can be produced during a rotation of the substrate 3 at a constant angular velocity ω(t) during the entire movement of the substrate 3 along the movement path 5. In the event that a coating rate RB of the coating material M emerging from the coating source 4 is also kept constant, the thickness or the layer thickness profile d(r, φ) of the layer 2 in the azimuthal direction along the surface 3*a* to be coated is constant, i.e. the thickness d(r, φ) does not depend on the azimuth angle φ but only on the distance r from the spin axis 7.

Figure 1B:
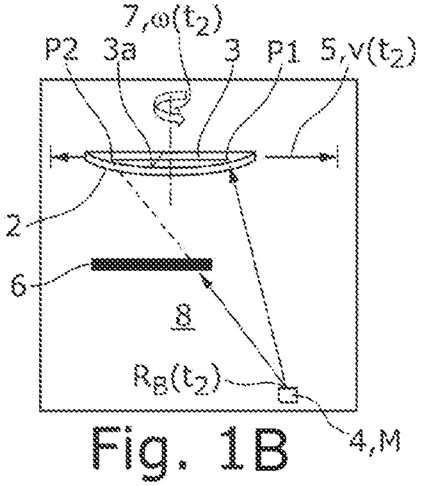

FIG. 1A shows a snapshot of the deposition process at a first time $t_1$, FIG. 1B shows a snapshot of the deposition process at a second, later time $t_2$. Between the two times $t_1$, $t_2$ shown in FIG. 1A and FIG. 1B, the substrate 3 was rotated around the spin axis 7 by 180°, so that a first and second point P1, P2 on the surface 3*a* to be coated, which have the same radial distance from the spin axis 7 and which are diametrically opposite each other, are reversed.

As can be seen in FIG. 1B, the thickness d(r, φ) of the deposited layer 2 at point P1 is greater than at point P2, i.e. the applied layer 2 has a non-rotationally symmetric layer thickness distribution d(r, φ). Such a non-rotationally symmetric layer thickness distribution d(r, φ) can be produced by varying the rotation speed ω(t) of the substrate 3 around the spin axis 7 and/or the coating rate RB during the movement of the substrate 3 along the rectilinear movement path. For example, for this purpose, the rotation speed $\omega(t_2)$ at the second time $t_2$ can be selected to be smaller than the rotation speed $\omega(t_1)$ at the first time $t_1$, so that more coating material M is deposited at the first point P1 of the surface 3*a* to be coated and the local thickness of the layer 2 at the first point P1 increases accordingly, as indicated in FIG. 1B.

Alternatively or in addition, the coating rate $R_B(t)$ can be varied during the movement along the movement path 5, for example, the coating rate $R_B(t_1)$ at the first time $t_1$ can be selected to be smaller than the coating rate $R_B(t_2)$ at the second time $t_2$, as a result of which the thickness of the layer 2 at the first point P1 of the surface 3*a* to be coated likewise increases compared with the thickness of the layer 2 at the second point P2, as indicated in FIG. 1B.

The coating material M, which is applied to the surface 3*a* to be coated of the substrate 3 is an oxide or a fluoride material in the example shown in FIGS. 1A,B. Oxides or fluorides are used for the production of reflective or anti-reflective coatings for optical elements for operation at wavelengths in the DUV wavelength range, as are described further below in connection with FIG. 4 and FIG. 5.

In order to deposit such an oxide or fluoride material on the surface 3*a* to be coated of the substrate 3, a reactive DC sputtering method is carried out in an oxygen gas atmosphere 8 (or alternatively in a fluorine gas atmosphere) in the coating apparatus 1 in the example shown in FIG. 1A. In this case, the coating material M is an electrically conductive sputtering target, e.g. Si, Al, Hf or Ti. The material of the sputtering target is usually removed with the aid of noble gas ions, which are accelerated from a plasma onto the target surface due to an electric potential applied to the sputtering target, and transferred into the gas phase. In this case, the gaseous coating material M, which emerges from the coating source 4, reacts with the oxygen in the oxygen gas atmosphere 8 and forms a corresponding oxide material, e.g. $SiO_2$, $Al_2O_3$, $HfO_2$ or $TiO_2$, which is deposited on the surface 3*a* to be coated of the substrate 3. For the deposition of layers 2 from fluoride materials which are substantially absorption-free in the DUV wavelength range, such as $MgF_2$ or $LaF_3$, the corresponding sputtering targets of Mg or La are provided as coating material M in the coating source 4 and transferred in the fluorine gas atmosphere 8 described further above in the coating apparatus 1 into the corresponding fluoride material $MgF_2$, $LaF_2$, which is deposited on the surface 3*a* to be coated.

As an alternative to the use of electrically conductive sputtering targets, electrically insulating sputtering targets can be used as coating material M in the coating source 1. In this case, the coating source 4 is formed to perform a pulsed sputtering method, a high-frequency sputtering method or an ion beam sputtering method, wherein the ion beam is produced by a separate ion beam source (not depicted). The coating material M may be, for example, ceramic sputtering targets, e.g. in the form of $SiO_2$, $Al_2O_3$, $HfO_2$ or $TiO_2$.

Figure 2A:
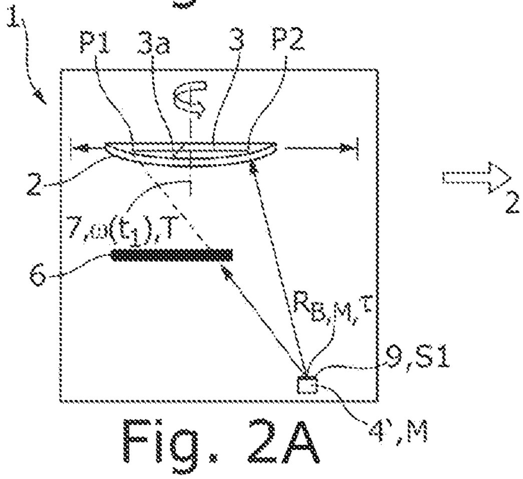

FIGS. 2A,B show a coating apparatus 1, which is formed analogously to the coating apparatus 1 shown in FIGS. 1A,B. The coating apparatus 1 shown in FIGS. 2A,B differs from the coating apparatus 1 shown in FIGS. 1A,B substantially in that the coating source 4' is a thermal evaporator source, rather than a sputter source 4 as in FIGS. 1A,B.

With the coating source 4' being in the form of the thermal evaporator source, the coating material M is transferred into the gas phase by thermal evaporation. For this purpose, the coating source 4' may include, for example, an electron beam evaporator or an electrical resistance heater. In thermal evaporation processes, a controlled variation of the coating rate $R_B$ is very limited, since the thermal noise of the evaporation rate and the inertia of the evaporation rate are many times higher when the evaporation performance changes than is the case with the removal rate of the sputtering target in sputtering processes.

For producing a free-form coating with a layer thickness d(r, φ) of the deposited layer 2, which varies in the azimuthal direction φ, it is therefore generally advantageous if the coating rate $R_B$ or the evaporation rate of the coating source 4 is kept as constant as possible and, for producing a layer 2 with a non-rotationally symmetric thickness profile d(r, φ), the rotation speed ω(t) of the substrate 3 is varied during the movement of the substrate 3 along the rectilinear movement path 5.

A substantially constant coating rate $R_B$ is understood to mean that, during the movement of the substrate 3 along the movement path 5, the coating rate $R_B(t)$ does not deviate by more than 10% from an average coating rate $R_{B,M}$ during the movement of the substrate 3 along the movement path 5, i.e.:

$0.9\ R_{B,M} < R_B(t) < 1.1\ R_{B,M}$. The average coating rate $R_{B,M}$ can be determined and regulated using one or more stationary sensors.

In addition, it is advantageous if average coating rates $R_{B,M}$ in successive time intervals with a time duration τ that is less by a factor of 50 to 500 than a period duration T of the rotation of the substrate 3 around the spin axis 7 deviate by no more than 10% from one another. The typical duration for one rotation of the substrate 3 is 1 s to 10 s, with the result that the statistical fluctuations of the evaporation or coating rate $R_B$ should not differ significantly from one another with regard to their average values, i.e. the average coating rate $R_{B,M}$, in time intervals of 10 ms to 100 ms as otherwise a systematic drift of the evaporation or coating rate $R_B$ is present, which undesirably influences the layer thickness profile resulting at the end of the coating process. Undesirable influences can typically be avoided if the average coating rates $R_{B,M}$ in respectively two consecutive time intervals with the time specified above deviate by no more than 10% from one another. In order to meet the abovementioned condition, the period duration T of the rotation of the substrate 3 can be specified appropriately or, if necessary, set during the coating process. The average coating rate $R_{B,M}$ or its fluctuation can be measured, for example, with the aid of the sensors described further above.

Figure 2B:
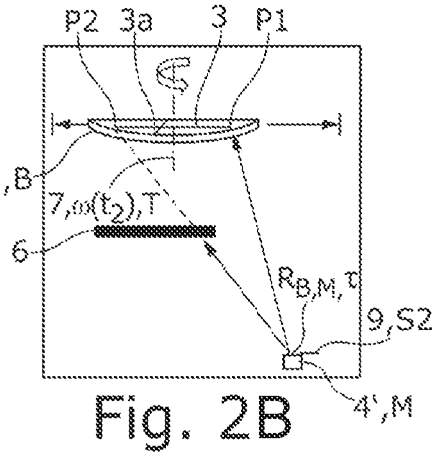

In order to change in a controlled manner the coating rate $R_B$, i.e. the rate at which the coating source 4' releases the coating material M, despite the problem described further above relating to the insufficiently controllable evaporation rate, the coating source 4' shown in FIGS. 2A,B has a cover 9. The cover 9 shown in FIGS. 2A,B can be used to vary the coating rate $R_B$ between a first position S1 shown in FIG. 2A, in which the cover 9 completely shadows the opening in the coating source 4' and thus the coating material M located in the coating source 4' so that the material can no longer reach the surface 3*a* to be coated, and a second position S2 shown in FIG. 2B, in which the cover 9 does not shadow the coating material M so that the material can escape unhindered from the coating source 4' and pass to the surface 3*a* to be coated or to the covering element 6, which partially shadows the surface 3*a* to be coated.

In the example shown in FIGS. 2A,B, the cover 9 is quickly rotated around a rotational axis which is arranged laterally next to the coating source 4', but it is also possible to quickly move the cover 9 back and forth between the first position S1 and the second position S2 in a different way. In contrast to what is shown in FIG. 2A, the cover 9 may optionally not completely cover or shadow the coating source 4' in the first position Si, so that some of the coating material M transferred into the gas phase can also reach the surface 3*a* to be coated in the first position Si.

With the aid of cover 9, the coating rate $R_B$ of the coating source 4' in the form of the thermal evaporator can be varied in a controlled manner such that in this case, too, due to the variation of the coating rate $R_B$, there is an additional, well-controllable degree of freedom during the deposition, which enables a free-form coating, i.e. a coating with any arbitrary, non-rotationally symmetric thickness profile d(r, φ) of the deposited layer 2.

Figure 3:
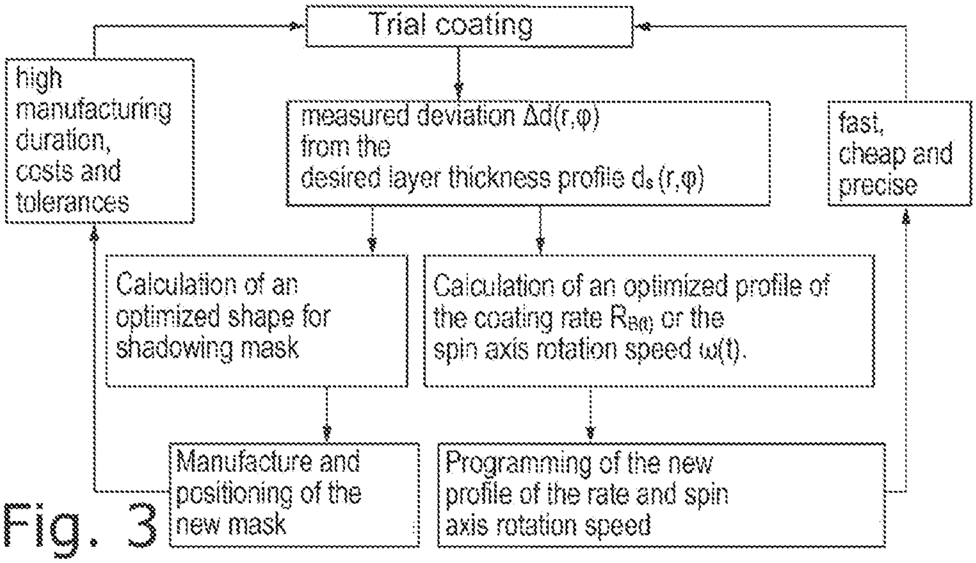
FIG. 3 shows a schematic illustration of a trial-and-error method for optimizing a specification of the coating rate and/or the rotation speed of the rotation of the substrate around the spin axis.

A further advantage of a free-form coating which is carried out in the manner described further above, i.e. by a controlled variation of the coating rate $R_B$ and/or the rotation speed ω(t) of the rotation of the substrate 3 around the spin axis 7, is that this is a time- and cost-saving option for approximating a desired layer thickness profile ds(r, φ) of the deposited layer 2 with the aid of a trial-and-error method, as illustrated below with reference to FIG. 3.

In the trial-and-error method, a layer 2 is applied as a trial coating onto the substrate 3 in a first step, as described further above in connection with FIGS. 1A,B and with FIGS. 2A,B. During the deposition of the layer 2, a variation of the coating rate $R_B(t)$ and/or the rotation speed ω(t) around the spin axis 7 is specified during the movement of the substrate 3 along the path curve 5, which is to produce a desired layer thickness distribution ds(r, φ) of the deposited layer 2, which is typically a free-form coating.

In a subsequent step, the (actual) layer thickness profile d(r, φ) of the deposited layer 2 is measured. The measurement of the layer thickness profile d(r, φ) of the layer 2 can be taken, for example, using an interferometric measurement method or in another way. In a subsequent step, a deviation Δd(r, φ) from the specified desired layer thickness profile ds(r, φ) is determined. For example, the deviation Δd(r, φ) can be the difference between the measured (actual) layer thickness profile d(r, φ) and the desired layer thickness profile ds(r, φ) of the deposited layer 2, i.e. $\Delta d(r, \varphi) = d(r, \varphi) - d_s(r, \varphi)$.

Depending on the measured deviation Δd(r, φ), a new, improved specification for the time profile of the variation of the coating rate $R_B(t)$ and/or the variation of the rotation speed ω(t) during the movement of the substrate 3 along the movement path 5 is calculated in a subsequent step. The new time profile of the variation of the coating rate $R_B(t)$ or the variation of the rotation speed ω(t) of the substrate 3 is programmed in the coating apparatus 1 or stored as a new specification in the integrated controller. The steps described further above may be repeated one or more times on further trial coatings, in which a layer 2 is applied one or more times onto the same substrate 3 (after removing the layer 2) or onto an identically shaped substrate 3 until the actual layer thickness distribution d(r, φ) is adapted to the desired layer thickness distribution ds(r, φ) as far as the process stability permits.

In contrast, with a free-form coating based on an optimized shape of a pinhole or honeycomb mask, it is necessary to first calculate an optimized shape of the shadowing mask for each trial coating and to subsequently manufacture and position such a shadowing mask, which results in a long production time, high production costs and high production tolerances (see FIG. 3). When using new, optimized masks for shadowing the substrate 1, manufacturing tolerances in the mask shape and mask optimization in the coating apparatus 1 additionally have a limiting effect on an approximation to the desired layer thickness profile ds(r, φ).

As described further above, the deposited layer 2 forms part of a reflective or anti-reflective coating B for the DUV wavelength range or the deposited layer 2 itself forms such a reflective or anti-reflective coating B. In the event that the coating B includes a plurality of layers 2, these typically serve to amplify the reflective or anti-reflective effect on the basis of interference effects. The substrate 3 coated with the coating B forms an optical element that can be used in optical arrangements for the DUV wavelength range. These optical arrangements, for example, can be the optical arrangements described below in FIG. 4 and FIG. 5.

Figure 4:
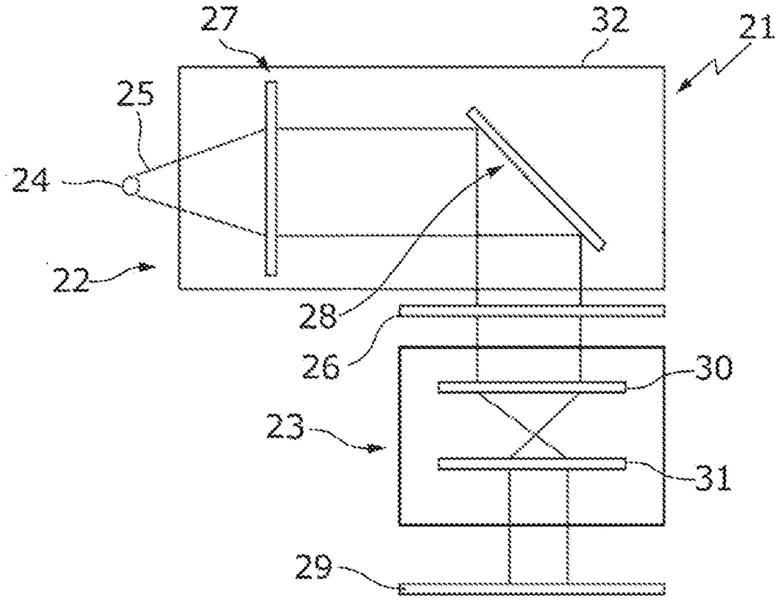
FIG. 4 shows a schematic illustration of an optical arrangement for the DUV wavelength range in the form of a DUV lithography apparatus.

FIG. 4 shows an optical arrangement for the DUV wavelength range in the form of a DUV lithography apparatus 21. The DUV lithography apparatus 21 comprises two optical systems, namely an illumination system 22 and a projection system 23. The DUV lithography apparatus 21 additionally has a radiation source 24, which can be an excimer laser, for example.

The radiation 25 emitted by the radiation source 24 is conditioned with the aid of the illumination system 22 such that a mask 26, also called a reticle, is illuminated thereby. In the example shown, the illumination system 22 has a housing 32, in which both transmissive and reflective optical elements are arranged. In a representative manner, the illustration shows a transmissive optical element 27, which focuses the radiation 25, and a reflective optical element 28, which deflects the radiation.

The mask 26 has, on its surface, a structure which is transferred to an optical element 29 to be exposed, for example a wafer, with the aid of the projection system 23 for the purpose of producing semiconductor components. In the example shown, the mask 26 is designed as a transmissive optical element. In alternative embodiments, the mask 26 can also be designed as a reflective optical element.

The projection system 22 has at least one transmissive optical element in the example shown. The example shown illustrates, in a representative manner, two transmissive optical elements 30, 31, which serve, for example, to reduce the structures on the mask 26 to the size desired for the exposure of the wafer 29.

Both in the illumination system 22 and in the projection system 23, a wide variety of transmissive, reflective or other optical elements can be combined with one another in an arbitrary, even more complex, manner. Optical arrangements without transmissive optical elements can also be used for DUV lithography.

Figure 5:
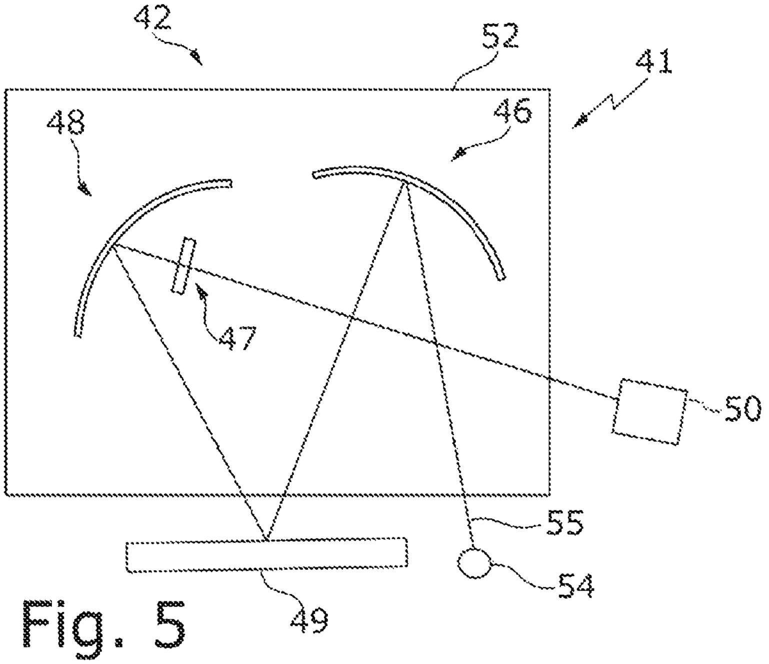
FIG. 5 shows a schematic illustration of an optical arrangement for the DUV wavelength range in the form of a wafer inspection system.

FIG. 5 shows an optical arrangement for the DUV wavelength range in the form of a wafer inspection system 41, but it may also be a mask inspection system. The wafer inspection system 41 has an optical system 42 with a radiation source 54, from which radiation 55 is directed onto a wafer 49 using the optical system 42. For this purpose, the radiation 55 is reflected onto the wafer 49 by a concave mirror 46. In the case of a mask inspection system, a mask to be examined could be arranged instead of the wafer 49. The radiation reflected, diffracted and/or refracted by the wafer 49 is directed onto a detector 50 for further evaluation by a further concave mirror 48, which is likewise associated with the optical system 42, via a transmissive optical element 47. The wafer inspection system 41 additionally has a housing 52, in which the two mirrors 46, 48 and the transmissive optical element 47 are arranged. The radiation source 54 can be for example exactly one radiation source or a combination of a plurality of individual radiation sources in order to provide a substantially continuous radiation spectrum. In modifications, one or more narrowband radiation sources 54 can also be used.

At least one of the optical elements 27, 28, 30, 31 of the DUV lithography apparatus 21 shown in FIG. 5 and at least one of the optical elements 46, 47, 48 of the wafer inspection system 41 shown in FIG. 6 are designed here as described further above. Their coatings B thus have at least one layer 2, for example a fluoride or an oxide, which has been deposited with the aid of the method described further above.

What is claimed is:

1. A method for depositing at least one layer of a coating which is reflective or anti-reflective to radiation in the deep ultraviolet (DUV) wavelength range onto a surface to be coated of a substrate for an optical element for the DUV wavelength range, comprising:

transferring a coating material into the gas phase in a coating source, wherein the coating material in the coating source is transferred into the gas phase by thermal evaporation, moving the substrate relative to the coating source along a predetermined movement path, wherein the substrate additionally rotates around a spin axis during the movement along the movement path and wherein a covering element is arranged between the coating source and the surface to be coated, which covering element covers the surface to be coated at least partially during the movement of the substrate along the movement path, wherein moving the substrate along the predetermined movement path comprises shifting the substrate along a rectilinear movement path in a translatory movement, and varying a rotation speed of the spin axis of the substrate during the movement of the substrate along the rectilinear movement path independently of a path speed along the rectilinear movement path to deposit the at least one layer of the coating in a non-uniform manner on the substrate, wherein the coating material, which is deposited on the surface to be coated, is an oxide coating material or a fluoride coating material, wherein the coating source has a cover, which is moved between a first position shadowing the coating material and a second position not shadowing the coating material to vary the coating rate.

2. The method as claimed in claim 1, wherein a coating rate during the movement of the substrate along the movement path deviates by no more than 10% from an average coating rate.

3. The method as claimed in claim 1, wherein average coating rates in successive time intervals with a time period that is less by a factor of 50 to 500 than a period duration of the rotation of the substrate around the spin axis deviate by no more than 10% from one another.

4. The method as claimed in claim 1, further comprising:

measuring a layer thickness profile of the deposited layer, determining a deviation between the measured layer thickness profile and a desired layer thickness profile, adapting a specification for the variation of the rotation speed during the movement of the substrate along the movement path in dependence on the deviation of the measured layer thickness profile from the desired layer thickness profile.

5. The method as claimed in claim 1, further comprising moving the cover from one of the first position or the second position to the other of the first position or the second position.

6. The method as claimed in claim 5, wherein moving the cover comprises rotating the cover.

7. The method as claimed in claim 5, wherein moving the cover comprises operating the cover as chopper of the source.

* * * * *